United States Patent
Wu et al.

(10) Patent No.: US 10,453,832 B2
(45) Date of Patent: Oct. 22, 2019

(54) SEAL RING STRUCTURES AND METHODS OF FORMING SAME

(71) Applicant: Taiwan Semiconductor Manufacturing Co., Ltd., Hsin-Chu (TW)

(72) Inventors: Kuo-Ming Wu, Zhubei (TW); Kuan-Liang Liu, Pingtung (TW); Wen-De Wang, Minsyoung Township (TW); Yung-Lung Lin, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/665,495

(22) Filed: Aug. 1, 2017

(65) Prior Publication Data

US 2018/0175012 A1    Jun. 21, 2018

Related U.S. Application Data

(60) Provisional application No. 62/434,647, filed on Dec. 15, 2016.

(51) Int. Cl.
*H01L 25/00* (2006.01)
*H01L 23/58* (2006.01)
(Continued)

(52) U.S. Cl.
CPC ............ *H01L 25/50* (2013.01); *H01L 23/585* (2013.01); *H01L 24/29* (2013.01); *H01L 24/66* (2013.01);
(Continued)

(58) Field of Classification Search
USPC ........................................................ 257/499
See application file for complete search history.

(56) References Cited

U.S. PATENT DOCUMENTS

| 5,744,827 A | 4/1998 | Jeong et al. |
| 7,759,755 B2 | 7/2010 | Adkisson et al. |

(Continued)

FOREIGN PATENT DOCUMENTS

| JP | 2013183073 A | 9/2013 |
| KR | 100749263 A | 8/2007 |
| WO | 20080164606 A1 | 2/2016 |

OTHER PUBLICATIONS

Heiman, D. "Photoluminescence Spectroscopy." Physics U600, Adv Lab I—Physics of Waves and Optics—Summer 2004, Northeastern University, Jun. 1, 2004.
(Continued)

*Primary Examiner* — Nilufa Rahim
(74) *Attorney, Agent, or Firm* — Eschweiler & Potashnik, LLC

(57) ABSTRACT

A three-dimensional (3D) integrated circuit (IC) includes a first IC die and a second IC die. The first IC die includes a first semiconductor substrate, and a first interconnect structure over the first semiconductor substrate. The second IC die includes a second semiconductor substrate, and a second interconnect structure that separates the second semiconductor substrate from the first interconnect structure. A seal ring structure separates the first interconnect structure from the second interconnect structure and perimetrically surrounds a gas reservoir between the first IC die and second IC die. The seal ring structure includes a sidewall gas-vent opening structure configured to allow gas to pass between the gas reservoir and an ambient environment surrounding the 3D IC.

20 Claims, 7 Drawing Sheets

US 10,453,832 B2

Page 2

(51) Int. Cl.
*H01L 23/00* (2006.01)
*H01L 25/065* (2006.01)
*H01L 25/18* (2006.01)
*H01L 23/31* (2006.01)

(52) U.S. Cl.
CPC .............. *H01L 24/69* (2013.01); *H01L 24/83* (2013.01); *H01L 24/89* (2013.01); *H01L 23/3114* (2013.01); *H01L 23/564* (2013.01); *H01L 24/73* (2013.01); *H01L 24/81* (2013.01); *H01L 25/0657* (2013.01); *H01L 25/18* (2013.01); *H01L 2224/1145* (2013.01); *H01L 2224/1161* (2013.01); *H01L 2224/1162* (2013.01); *H01L 2224/11462* (2013.01); *H01L 2224/11845* (2013.01); *H01L 2224/13147* (2013.01); *H01L 2224/17517* (2013.01); *H01L 2224/2745* (2013.01); *H01L 2224/2761* (2013.01); *H01L 2224/2762* (2013.01); *H01L 2224/27462* (2013.01); *H01L 2224/27845* (2013.01); *H01L 2224/29011* (2013.01); *H01L 2224/29012* (2013.01); *H01L 2224/29015* (2013.01); *H01L 2224/29019* (2013.01); *H01L 2224/29035* (2013.01); *H01L 2224/29147* (2013.01); *H01L 2224/73103* (2013.01); *H01L 2224/73203* (2013.01); *H01L 2224/81193* (2013.01); *H01L 2224/81815* (2013.01); *H01L 2224/81895* (2013.01); *H01L 2224/8392* (2013.01); *H01L 2224/83193* (2013.01); *H01L 2224/83815* (2013.01); *H01L 2224/83895* (2013.01); *H01L 2224/83935* (2013.01); *H01L 2224/83951* (2013.01)

(56) References Cited

U.S. PATENT DOCUMENTS

| | | | |
|---|---|---|---|
| 10,157,944 | B2 | 12/2018 | Huang et al. |
| 2001/0005018 | A1 | 6/2001 | Oh |
| 2002/0024058 | A1 | 2/2002 | Marshall |
| 2004/0161865 | A1 | 8/2004 | Yu |
| 2005/0133723 | A1 | 6/2005 | Lee |
| 2007/0072409 | A1 | 3/2007 | Ulmer |
| 2008/0164606 | A1 | 7/2008 | Greisen et al. |
| 2009/0014751 | A1 | 1/2009 | Kim et al. |
| 2010/0001405 | A1 | 1/2010 | Williamson et al. |
| 2010/0038801 | A1 | 2/2010 | Gu et al. |
| 2010/0267184 | A1 | 10/2010 | Noh |
| 2010/0302424 | A1 | 12/2010 | Yamaguchi |
| 2011/0001038 | A1 | 1/2011 | Tseng et al. |
| 2011/0089571 | A1 | 4/2011 | Venezia |
| 2011/0240997 | A1 | 10/2011 | Rockenberger et al. |
| 2012/0068355 | A1* | 3/2012 | Aoki ................... H01L 25/0657 257/774 |
| 2012/0273907 | A1 | 11/2012 | Lim |
| 2012/0326248 | A1 | 12/2012 | Daneman et al. |
| 2013/0027073 | A1* | 1/2013 | Pagani ............... G01R 31/2889 324/756.03 |
| 2013/0052760 | A1 | 2/2013 | Cho |
| 2013/0330846 | A1 | 12/2013 | Tang |
| 2014/0177081 | A1 | 6/2014 | Sugishima et al. |
| 2014/0253768 | A1 | 9/2014 | Li |
| 2014/0353828 | A1* | 12/2014 | Edelstein .......... H01L 21/76885 257/751 |
| 2015/0028493 | A1* | 1/2015 | Nakamura ............ H01L 23/481 257/774 |
| 2015/0279885 | A1 | 10/2015 | Tu et al. |
| 2015/0287761 | A1 | 10/2015 | Huang |
| 2016/0181104 | A1 | 6/2016 | Schmidt |
| 2016/0181228 | A1* | 6/2016 | Higuchi .................. H01L 25/07 257/774 |
| 2016/0343532 | A1 | 11/2016 | Chuang |
| 2018/0350853 | A1 | 12/2018 | Huang et al. |

OTHER PUBLICATIONS

Cressler, et al. "SiGe HBT Technology: A New Contender for Si-Based RF and Microwave Circuit Applications." IEEE Transactions on Microwave Theory and Techniques, vol. 46, No. 5, May 1998.

Zimmermann, H. "Integrated Silicon Optoelectronics." Chapter 1—Basics of Optical Emission and Absorption. 2010, XX, 386 p. 321 illus., 6 illus. in color., Hardcover. ISBN: 978-3-642-01520-5.

Xu, et al. "Electronic Band Structure and Optical Properties of Silicon Nanoporous Pillar Array." Physica E41(2009) 1882-1885, published Aug. 25, 2009.

Li, et al. "Broadband Infrared Photoluminescence in Silicon Nanowires with High Density Stacking Faults." Nanoscale, 2015, 7, 1601.

Wilamowski, et al. "Fundamentals of Industrial Electronics." Chapter 9—Bipolar Junction Transistor. Published Mar. 4, 2011. ISBN 9781439802793.

Sun, et al. "Delay Time Constant Analysis for Ft Optimization in RF Si/SiGe Bipolar Devices." IEEE article. ISBN 0-7803-7749-4, published in 2003.

Tubert, et al. "High Speed Dual Port Pinned-photodiode for Time-Of-Flight Imaging." 2009 International Image Sensor Workshop, Bergen, Norway, Jun. 22-28, 2009.

Watts, Anthony. A Window on Water Vapor and Planetary Temperature. Published on Jun. 18, 2008. Retrieved from on May 15, 2017. https://wattsupwiththat.com/2008/06/18/a-window-on-water-vapor-and-planetary-temperature/ on May 15, 2017.

Kaufmann, et al. "Near Infrared Image Sensor with Integrated Germanium Photodiodes." Journal of Applied Physics • Jul. 2011.

Bob, et al. "Fabrication and Subband Gap Optical Properties of Silicon Supersaturated with Chalcogens by Ion Implantation and Pulsed Laser Melting." Journal of Applied Physics 107, 123506 (2010).

Liu, Jia-Ming. "Photonic Devices." Chapter 14—Lecture 12: Photodiode Detectors. Published online Jan. 2010, ISBN # 9780511614255.

Mayonado, et al. "Investigation of the Bragg-Snell Law in Photonic Crystals." 2015 BFY Proceedings. Edited by Eblen-Zayas, Behringer, and Kozminski; Peer-reviewed, doi:10.1119/bfy.2015.pr.015.

Wang, et al. "Light Trapping in Photonic Crystals." Energy Environ. Sci., 2014, 7, 2725-2738.

Gong, et al. "Photonic Crystals: Principals and Applications." Published Dec. 10, 2013. International Standard Book No. 13: 978-981-4364-83-6 (eBook - PDF).

U.S. Appl. No. 15/449,284, filed Mar. 3, 2017.
U.S. Appl. No. 15/597,452, filed May 17, 2017.
Non-Final Office Action dated Oct. 23, 2017 in connection with U.S. Appl. No. 15/449,284.
Notice of Allowance dated Mar. 30, 2018 in connection with U.S. Appl. No. 15/449,284.
Non-Final Office Action dated Apr. 13, 2018 in connection with U.S. Appl. No. 15/597,452.
Non-Final Office Action dated Apr. 6, 2018 for U.S. Appl. No. 15/609,325.
U.S. Appl. No. 15/609,325, filed May 31, 2017.
Notice of Allowance dated Sep. 7, 2018 in connection with U.S. Appl. No. 15/597,452.
Non-Final Office Action dated Apr. 6, 2018 in connection with U.S. Appl. No. 15/609,325.
Non-Final Office Action dated Oct. 20, 2017, in connection with U.S. Appl. No. 15/449,284.
Notice of Allowance dated Feb. 28, 2019 in connection with U.S. Appl. No. 15/609,325.
Final Office Action dated Nov. 19, 2018 in connection with U.S. Appl. No. 15/609,325.
Notice of Allowance dated Apr. 4, 2019 in connection with U.S. Appl. No. 16/190,608.
Non Final Office Action dated Aug. 13, 2019 for U.S. Appl. No. 16/127,322.

* cited by examiner

US 10,453,832 B2

SEAL RING STRUCTURES AND METHODS OF FORMING SAME

REFERENCE TO RELATED APPLICATION

This Application claims priority to U.S. Provisional Application No. 62/434,647 filed on Dec. 15, 2016, the contents of which are hereby incorporated by reference in their entirety.

BACKGROUND

The semiconductor industry has continually improved the processing capabilities and power consumption of integrated circuits (ICs) by shrinking a minimum feature size. However, in recent years, process limitations have made it difficult to continue shrinking the minimum feature size for features on the ICs for successive technology nodes. The stacking of two-dimensional (2D) ICs into three-dimensional (3D) ICs has emerged as a potential approach to continue improving processing capabilities and power consumption of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
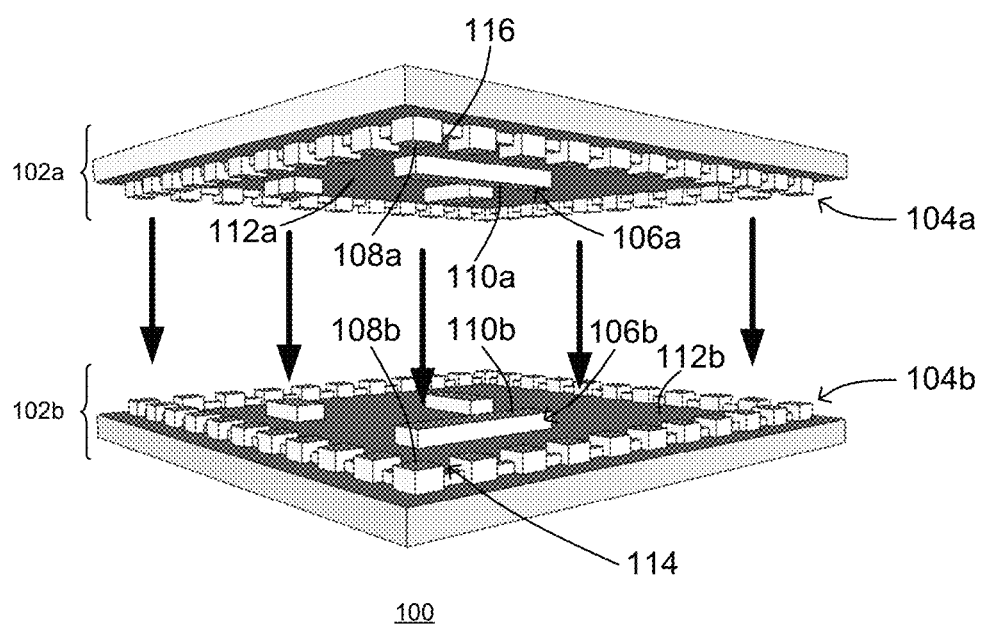
FIG. 1 illustrates a perspective exploded view of some embodiments of a three-dimensional (3D) integrated circuit (IC) die with a seal ring structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., conductive wire) may be referred to as a "first" element in some embodiments, the element may be referred to as a "second" element in other embodiments.

One type of three-dimensional (3D) integrated circuit (IC) comprises a first IC die and a second IC die stacked over the first IC die. The first IC die includes a first semiconductor substrate and a first interconnect structure; while the second IC die includes a second semiconductor substrate and a second interconnect structure. The first and second interconnect structures each comprise alternating stacks of wiring layers and via layers. Contact pads or plugs are disposed on upper surfaces of the first and second interconnect structures. The contact pads or plugs of the first IC die are in direct contact with the contact pads or plugs of the second IC die to bond the first and second IC dies to one another.

A seal ring structure, which is sandwiched between the first and second IC dies, perimetrically encloses the contact pads or plugs of the first and second IC dies, and protects the 3D IC. For example, the seal ring structure may protect the 3D IC from a die saw, and/or moisture and/or gases diffusing into (or out of) the 3D IC die. In some technologies, the seal ring structure is formed when a first seal ring segment, which is disposed on a face of the first IC die, is bonded to a second seal ring segment, which is disposed on a face of the second IC die. An outer surface of each seal ring segment is continuously planar over its entire extent, and is co-planar with the contact pads or plugs of that IC die. Thus, when the first and second seal ring segments are pressed together to bond the first IC to the second IC, the seal ring segments collectively form the seal ring structure to protect the contact pads or plugs. Because each seal ring segment has an outer surface that is continuously planar, this configuration helps ensure maximum surface area for bonding between the seal ring segments, and helps ensure good electrical connection between the contact pads or plugs on adjacent faces of the first and second die. However, some aspects of the present disclosure contemplate that fully co-planar seal rings and contact pads or plugs can actually be detrimental in that, during manufacturing when the first and second ICs are pressed together, gas can be trapped within an inner cavity that is bounded by the seal ring and confined between the faces of first and second ICs. As the first and second ICs are pressed together for hybrid bonding, the trapped gas can cause the first and second ICs to be pushed away from one another, leading to reliability concerns, particularly in the wake of temperature changes which can alter the pressure asserted by the trapped gas.

In view of the foregoing, various embodiments of the present application are directed towards techniques that utilize a seal ring with a sidewall gas-venting structure. This sidewall gas-venting structure includes openings that allow gas to escape from within the confines of the seal ring between the first and second IC dies, but the structure still promotes strong hybrid bonding between the first and second IC dies. The structure may also be beneficial in that the openings can also limit propagation of pressure waves that can arise during bonding, and can thereby help improve bonding effectiveness.

With reference to FIGS. 1-5, some embodiments of a 3D IC 100 with a seal ring structure is provided. As illustrated in FIG. 1's perspective exploded view, the 3D IC 100 includes a first IC die 102a including first seal ring segment 104a that perimetrically circumscribes one or more first contact plugs or contact pads (e.g., 106a), and a second IC die 102b including a second seal ring segment 104b that perimetrically circumscribes one or more second contact plugs or contact pads (e.g., 106b). The first and second seal ring segments 104a, 104b have nearest faces (e.g., 108a, 108b, respectively), which are planar or substantially planar, and which are co-planar or substantially co-planar with nearest faces of the first and second contact plugs or contact pads (110a, 110b, respectively). Notably, the first seal ring segment 104a can extend outward beyond a face 112a of the first IC die 102a, such that a first recess is defined along face 112a within seal ring segment 104a; while the second seal ring segment 104b can extend outward beyond a face 112b of the second IC die 102b, such that a second recess is defined along face 112b within seal ring segment 104b. Due to this geometry, the first and second recesses can serve as a gas reservoir 116 (see FIG. 3) when the first seal ring segment 104a is bonded to the second seal ring segment 104b.

Figure 2:
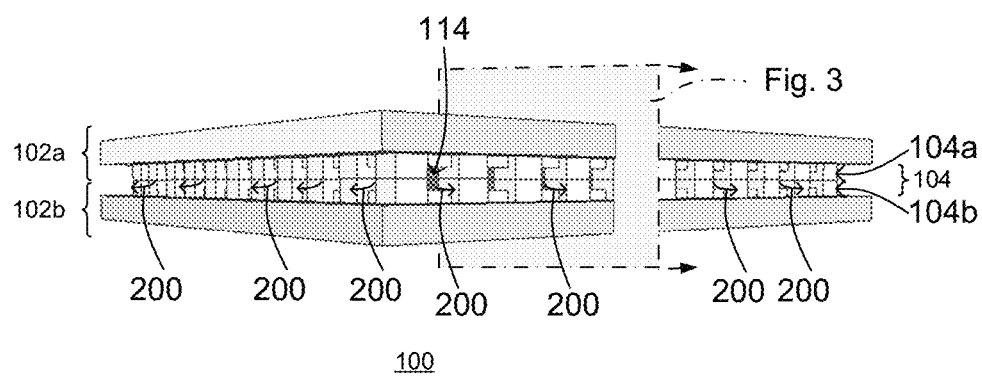
FIG. 2 illustrates a perspective view of some embodiments of the 3D IC of FIG. 1 with a first IC bonded to a second IC at a seal ring structure.

As shown in FIG. 2, when the first IC die 102a and second IC die 102b are bonded together, for example at a hybrid bond interface, the nearest faces (which may also be referred to as first and second bonding surface regions 108a, 108b, respectively) of the first and second seal ring segments (104a, 104b) are in direct contact with one another, and nearest faces (e.g., 110a, 110b in FIG. 1) of the first and second contact plugs are in direct contact with one another. The first and second bonding surface regions 108a, 108b of the first and second seal ring segments 104a, 104b are configured to directly contact one another, so as to provide a sufficient contact area that yields a hybrid bond of sufficient strength to bond the first IC die 102a to the second IC die 102b. The first and second contact pads or plugs 106a, 106b are also in direct contact, thereby electrically coupling the first contact pads or plugs to the second contact pads or plugs. The first and second seal ring segments 104a, 104b, prior to bonding or after bonding, may also be referred to individually and/or collectively as a seal ring structure 104.

The seal ring structure 104 extends from one IC die (e.g., the first IC die 102a) to another IC die (e.g., the second IC die 102b), such that the seal ring structure 104 defines a wall or barrier protecting the 3D IC. For example, the seal ring structure 104 may protect the 3D IC from a die saw singulating the first and second IC dies 102a, 102b and/or from gases diffusing into (or diffusing out of) the first and second IC dies 102a, 102b from (or into) an ambient environment of the first and second IC dies 102a, 102b. Further, although FIG. 1 illustrates the seal ring structure 104 is made up of a single ring-shaped structure, in other embodiments the seal ring structure can include multiple rings that are concentrically aligned.

In some embodiments, the first contact plugs or contact pads 106a and the first seal ring segment 104a are made of the same material or have the same composition. In other embodiments, the first seal ring segment is distinct from, and/or a different material than, the first contact plugs or contact pads. For example, in some embodiments, the first seal ring segment and first contact plugs or contact pads are made of pure elemental copper or are made of a copper alloy. Similarly, in some embodiments, the second seal ring segment 104b is integrated with, and/or the same material as, the second contact plugs or contact pads 106b. In other embodiments, the second seal ring segment is distinct from, and/or a different material than, the second contact plugs or contact pads. The second seal ring segment can be made of the same material as the first seal ring segment in typical embodiments, but can also be made of different material and/or have different compositions in other embodiments.

Notably, the bonding surface for at least one of the first and/or second seal ring segments 104a, 104b is broken or punctured by one or more sidewall openings 114, which establish a sidewall gas-venting structure that allows gas to escape from the gas reservoir 116 (see e.g., gas flow arrows 200 in FIG. 2). In this way, the surfaces of the first and second seal ring segments, which can include uppermost planar portions (e.g., 108a) and recessed portions (e.g., 116), are structured to allow for gas ingress and egress to mitigate pressure buildup and to facilitate more reliable hybrid bonding at the hybrid bond interface.

In some cases, only a single sidewall recess is present within only one of the first and second seal ring segments 104a, 104b, which is advantageous in that it provides a very large surface bonding area on the seal ring segments, while in other cases, such as illustrated in FIGS. 1-5, many sidewall recesses are present, which is advantageous in that it tends to allow better gas flow for ingress/egress. In some embodiments where multiple sidewall recesses are present, the sidewall opening 114 can be distributed at regular intervals and can have equal sizes as one another, while in these and other embodiments the sidewall opening 114 can be randomly distributed and/or have different sizes from one another.

Figure 3:
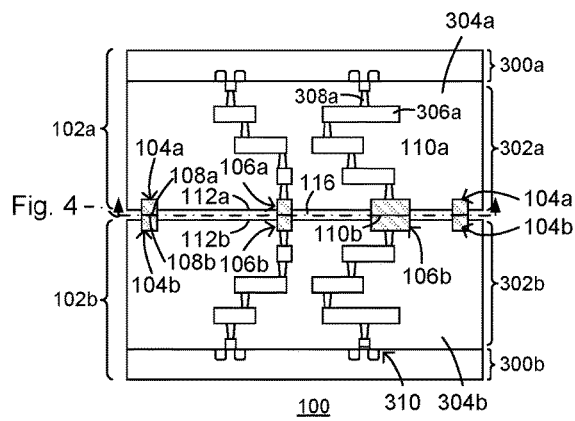
FIG. 3 illustrates a cross-sectional view of some embodiments of FIG. 2's 3D IC along the plane depicted in FIG. 2.

FIG. 3 shows a cross-sectional view of the 3D IC 100 of FIG. 2, as indicated by the cross-sectional plane depicted in FIG. 2. As can be seen in FIG. 3, the first IC die 102a includes a first semiconductor substrate 300a while the second IC die 102b includes a second semiconductor substrate 300b. In some embodiments, the semiconductor substrates 300a, 300b are bulk substrates of monocrystalline silicon or some other semiconductor, or are semiconductor-on-insulator (SOI) substrates, or other substrates, or a combination of the foregoing. Further, in some embodiments, the semiconductor substrates 300a, 300b have respective thicknesses that are the same or different. For example, the first semiconductor substrate 300a of the first IC die 102a may have a first thickness and the second semiconductor substrate 300b of the second IC die 102b may have a second thickness that is equal to or greater than the first thickness.

The first and second IC dies 102a, 102b also include first and second interconnect structures 302a, 302b respectively, which separate the semiconductor substrates 300a, 300b from one another. A first interconnect structure 302a comprises an interlayer dielectric (ILD) layer 304a, a first wiring layer 306a, and a first via layer 308a. Similarly, a second interconnect structure 302b comprises an interlayer dielectric (ILD) layer 304b, a first wiring layer 306b, and a first via layer 308b. Other wiring layers, via layers, and/or contact layers can also be present, and any number of such layers may be present depending on the technology involved. The ILD layers may be, for example, silicon dioxide, a low κ dielectric, some other dielectric, or a combination of the foregoing. As used here, a low κ dielectric is a dielectric with a dielectric constant κ less than about 3.9. The wiring layers, the via layers, and contact layers are conductive and may be, for example, aluminum copper, copper, aluminum, tungsten, some other metal or conductive material, or a combination of the foregoing. In some embodiments, the seal ring structure 104 is isolated from the metal layers and vias of the first and second interconnect structures.

A plurality of semiconductor devices, such as transistor device 310, are electrically coupled to one another through the first and/or second interconnect structures 302a, 302b. In some embodiments, the semiconductor devices are active and/or passive devices, and/or are in the semiconductor substrates 300a, 300b of FIG. 3 and/or the interconnect structures 302a, 302b of FIG. 3. For example, the semiconductor devices may comprise insulated-gate field-effect transistors (IGFETs) or metal-oxide-semiconductor field-effect transistors (MOSFETs), bipolar junction transistors (BJTs), fin field effect transistors (FinFETs), diodes, and/or other devices, arranged in the semiconductor substrates of FIG. 3. As another example, the semiconductor devices may comprise metal-insulator-metal (MIM) capacitors, resistive random-access memory (RRAM), or spiral inductors arranged in the interconnect structures 302a, 302b of FIG. 3.

Figure 4:
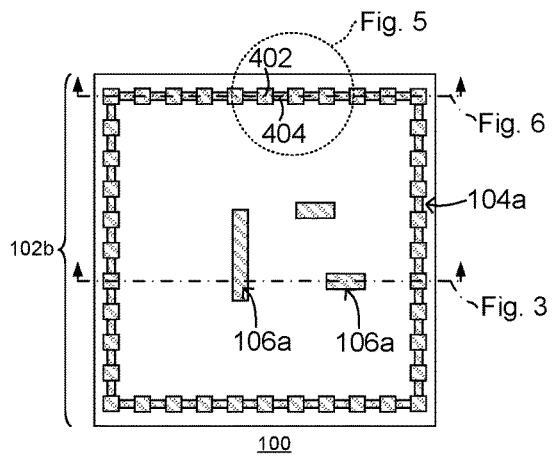
FIG. 4 illustrates a top view of some embodiments of a first IC die, which includes a first seal ring segment circumscribing contact pads or contact plugs, in accordance with some embodiments of FIG. 3.
Figure 5:
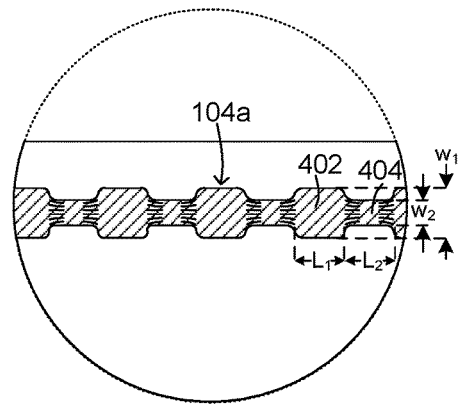
FIG. 5 illustrates a top view of some embodiments of a portion of a seal ring structure corresponding to the inset area shown in FIG. 4.

As shown in FIG. 4, in some embodiments the first seal ring segment 104a includes a series of cube-like or box-like structures 402, 404. A first cube-like or box-like structure 402 is relatively wide and relatively tall, while a second cube-like or box-like structure 404 is relatively narrow and relatively short in comparison. Consecutive cube-like or box-like structures can have squared off corners as shown in FIG. 4, or can have rounded or tapered corners, as shown in FIG. 5. In FIG. 5, consecutive cube-like or box-like structures 402, 404 are shown to alternate between a first width, $w_1$, and a second width, $w_2$, which is less than the first width. Further, in some embodiments, the cube-like or box-like structures 402 have a first length, $L_1$ and the shorter cube-like or box-like structures have a second length, $L_2$, which can be equal to the first length as shown in FIG. 5. In other embodiments, the second length can differ from the first length for example the second length can be less than or greater than the first length. The first length and second length can each range from approximately 0.6 jam to approximately 4 µm, and can each be approximately 0.6 µm in some embodiments. The first width and second width can each range from approximately 0.8 µm to approximately 8 µm, and can each be approximately 1 µm in some embodiments.

Figure 6:
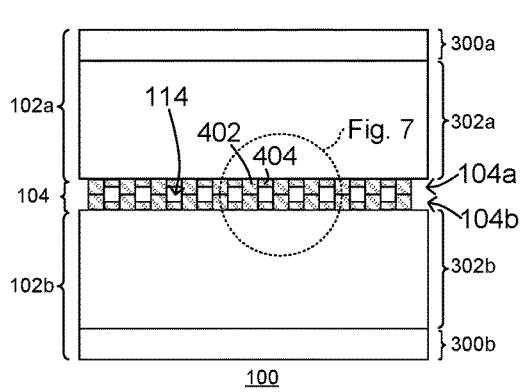
FIG. 6 illustrates a cross-sectional view of some embodiments of a 3D IC including a first IC bonded to a second IC at a seal ring structure, along a cross-sectional plane as indicated on FIG. 4.

As shown in FIG. 6, consecutive cube-like or box-like structures alternate between taller cube-like or box-like structures 402 and shorter cube-like or box-like structures 404. The taller cube-like or box-like structures 402 can have a first height, $h_1$, and the shorter cube-like or box-like structures 404 can have a second height, $h_2$, wherein the heights can be measured vertically from the face of the first IC die and/or second IC die. Thus, the taller cube-like or box-like structures 402, which are at the first height, have uppermost surfaces 402a, 402b that are coplanar with one another, and the shorter cube-like or box-like structures 404 have uppermost surfaces 404a, 404b that are recessed relative to the uppermost surfaces of the taller cube-like or box-like structures 402. Although not shown in FIG. 6-7, the first contact pads or contact plugs 106a (see FIG. 3) have a third height, which is equal to the first height, and which is greater than the second height. In this way, when the first IC die 102a is bonded to the second IC die 102b, the first and second contact pads or contact plugs 106a, 106b have faces that directly contact one another so as to be planarly flush with one another. Taller cube-like or box-like structures (e.g., 402 in FIGS. 4-7) are also planarly flush with one another, while shorter cube-like or box-like structures (e.g., 404 in FIGS. 4-7) give rise to a sidewall opening 114 that allows gas to escape from the gas reservoir 116 circumscribed by the first and second seal ring segments 104a, 104b. For example, a height ratio of $h_2/h_1$ can range from zero to 0.999 in some embodiments, and can range from 0.25 to 0.75 in other embodiments, and can be approximately 0.50 in still other embodiments.

Figure 7:
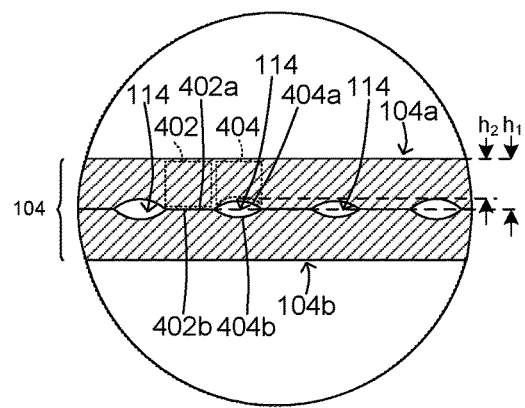
FIG. 7 illustrates a cross-sectional view of some embodiments of a portion of a seal ring structure corresponding to the inset area shown in FIG. 6.

In some embodiments, such as shown in FIG. 7, the uppermost surfaces of the shorter cube-like or box-like structures 404 are rounded or tapered and are recessed relative to the uppermost surfaces 402a, 402b, respectively of the taller cube-like or box-like structures 402. In some of these embodiments, the rounded or tapered uppermost surfaces 404a, 404b can exhibit CMP scratches or abrasions, which arise from CMP "dishing" of the shorter cube-like or box-like structures 404 during manufacture.

Because the uppermost surfaces of the taller cube-like or box-like structures are in direct contact with one another and can be wider than the shorter cube-like or box-like structures in some embodiments, a surface contact area between the first and second seal ring segments can be greater than 50% in some embodiments. For example, in some embodiments, the surface area of the uppermost surface of each taller cube-like or box-like structure can be approximately 1 µm², while the surface area of the uppermost surface of each shorter cube-like or box-like structure can be approximately 0.36 µm². Thus, the ratio of the surface area of the uppermost surface of each taller cube-like or box-like structure to the surface area of the uppermost surface of each shorter cube-like or box-like structure can be approximately 36% in some cases, but can more generally range between 5% and 95%, depending on the implementation. In these and other embodiments, the contact surface area between the first and second seal ring segments can range between 1% and 99%, or between 20% and 70% in other embodiments, and being approximately between 25% and 50% in still other embodiments.

While FIGS. 1-4 and 6 show the sidewalls of the cube-like or box-like structures as being planar, in other embodiments the sidewalls can have a rounded surface geometry, tapered surface geometry, spherical or sphere-like surface geometry, undulating surface geometry, saddle-like geometry, or other non-planar surface geometry—see e.g., FIG. 5 and FIG. 7. Vertical sidewalls or substantially vertical sidewalls, as illustrated, are advantageous however, in that they provide a relatively compact footprint from the seal ring while will providing a relatively large amount of planar surface area for bonding at the interface to the other IC die. On the other hand, due to dishing of small areas, rounded or tapered surfaces may evidence the use of CMP in forming gas-venting structures, which may save one or more masks steps and are perhaps even more advantageous.

With reference to FIGS. 8-13, a series of perspective views illustrate some embodiments for a method of manufacturing a 3D IC die with a seal ring structure. While the methods herein are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 8:
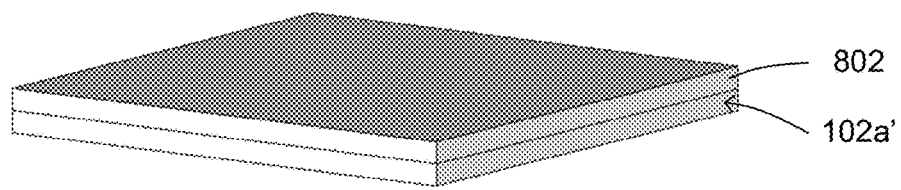
FIGS. 8, 9, 10, 11, 12, and 13A-13C illustrate a series of perspective views of some embodiments of a method for manufacturing a 3D IC die with a seal ring structure.

In FIG. 8, a first IC die precursor 102a' is formed, and a conductive bond ring and pad layer 802 is formed over an upper surface of the first IC die precursor. For example, in some embodiments, the conductive bond ring and pad layer 802 is made of copper, copper alloy, aluminum, or another metal, and is formed by electroplating or by sputtering. In some embodiments, the first IC die precursor 102a' can include a substrate and interconnect structure, such as illustrated and described with regards to FIG. 3 for example.

Figure 9:
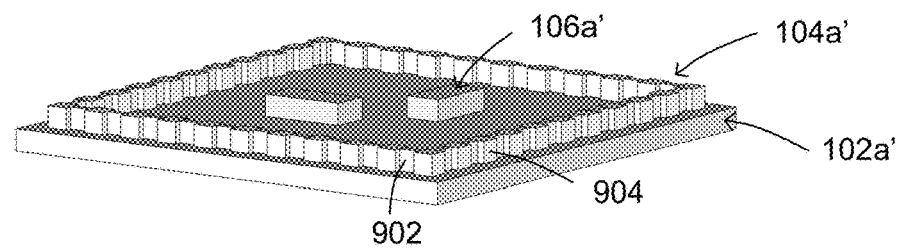

In FIG. 9, a first mask (not shown) is formed over an upper surface of the conductive bond ring and pad layer 802 using lithography techniques. A first etch, such as a wet etch, dry etch, plasma etch, or other etch, is carried out with the first mask in place to form one or more conductive pads or plugs 106a' extending upward from a face of the first IC die precursor 102a', and to form a bond-ring precursor 104a' circumscribing the one or more conductive pads or plugs 106a'. The bond ring precursor 104a' has a substantially planar upper surface, which extends in continuous planar fashion around the entirety of the bond ring precursor 104a'. The substantially planar upper surface may have some hillocks or valleys which were present in the initial conductive bond ring and pad layer 802, which could arise due to random fluctuations in the deposition or sputtering process. As viewed from above, the bond ring precursor 104a' has at least one narrow portion 902 which will correspond to a sidewall vent region in the bond ring precursor. In the illustrated embodiment, a series of narrow portions 902 having equal widths and lengths are distributed at regular intervals over the perimeter of the bond ring precursor 104a'. The narrow portions 902 are spaced apart from one another by wide portions 904 of the bond ring precursor. Depending on the characteristics of the first etch, the sidewalls of the wide portions 904 may have tapered sidewalls or vertical sidewalls. In some cases, the first etch may result in the wide portions 904 being cube-like, box-like, cylindrical, pyramid, frustum pyramid in shape, or frustum cone in shape, or if the etch undercuts the mask, being inverted frustum pyramid in shape or inverted frustum cone in shape. Narrow portions 902 can also be cube-like, box-like, cylindrical, pyramid, frustum pyramid in shape, frustum cone in shape, inverted frustum pyramid in shape or inverted frustum cone in shape. In combination, the narrow portions 902 and wide portions 904 perimetrically surround an area on a face of the first IC die precursor 102a'.

Figure 10:
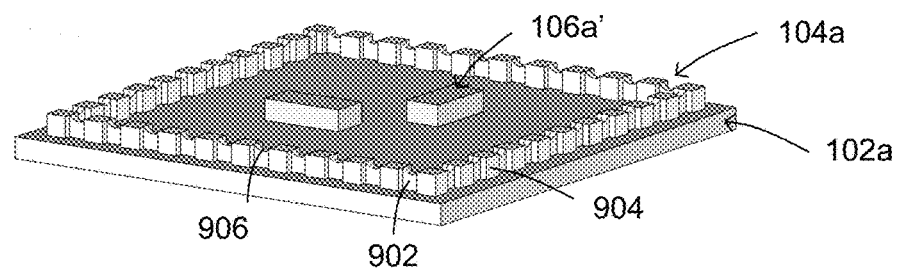

In FIG. 10, a chemical mechanical planarization (CMP) operation is carried out to fashion a seal ring segment 104a. The seal ring segment 104a has wide portions 904 with upper planar surfaces which are co-planar with one another, thereby providing a good bonding surface. Due to the narrow portions 902 having less structural integrity than the wide portions 904, upper surfaces of the narrow portions may experience "dishing" (see 906) and may thereby become recessed relative to upper surfaces of the wide portions. Thus, sidewall recesses for venting of gas, which correspond to a concave upper surface of the narrow portions 902, can be formed in the seal ring segment 104a in this manner. Upper corners of the wide regions may also become rounded due to the CMP, while central portions of the wide regions tend to become well planarized with upper surfaces of the conductive pads or plugs. The uppermost surfaces of the narrow regions can be rounded or tapered, and can include CMP abrasions or scratches arising from the CMP process used.

In some embodiments, rather than using CMP to form the recesses in the narrow portions 902 of the seal ring segment 104a, the recesses could also be formed by patterning a second mask over the wide portions 904 of the seal ring segment 104a, and then carrying out an etch with the second mask in place. Depending on the etch characteristics, the sidewalls of the wide portions may have tapered sidewalls or vertical sidewalls. In some cases, the second etch may result in the wide portions being frustum pyramid in shape or frustum cone in shape, or if the etch undercuts the mask, being inverted frustum pyramid in shape or inverted frustum cone in shape. It will be appreciated, however, that forming the concave recesses in the narrow portions 902 of the seal ring segment 104a through CMP is particularly advantageous in that it saves the capital expense of a mask as well as the processing time and costs associated with the photolithography and subsequent etching. Therefore, the narrow portions 902 of the seal ring segment 104a having a rounded or tapered upper surface that extends in a circular, parabolic, or other continuous curve between planar upper surfaces of neighboring wide portions is an advantageous configuration.

Figure 11:
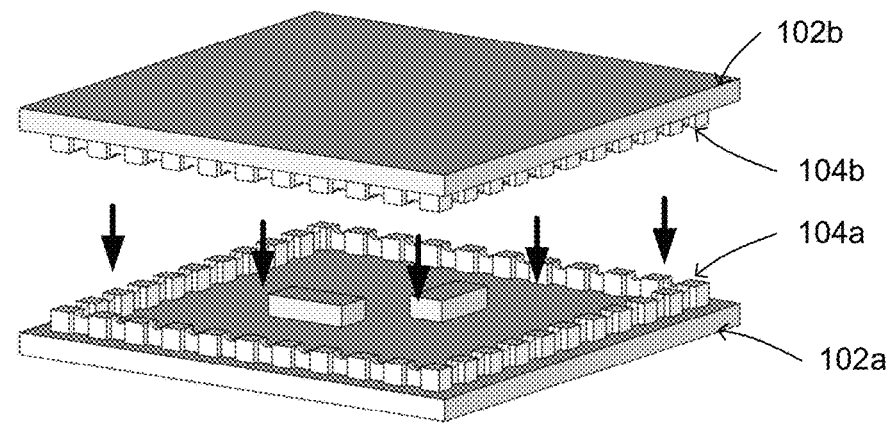

In FIG. 11, the first IC die 102a is place in close proximity to a second IC die 102b. The second IC die 102b can correspond to the second IC die 102b previously described in FIGS. 1-5, for example, and/or can have structural features corresponding to the first IC die 102a, albeit most likely with devices arranged in a different circuit configuration on the first and second IC die. Thus, in some embodiments, the second IC die 102b includes a second bond ring segment 104b that is congruous and/or geometrically similar to the first bond ring segment 104a.

Figure 12:
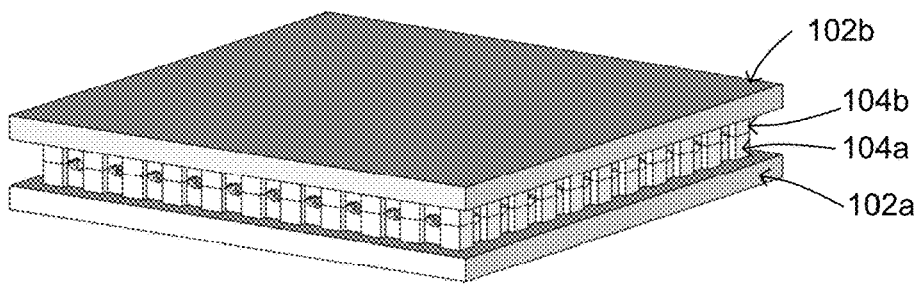

In FIG. 12, the first IC die 102a is bonded to the second IC die 102b, for example through a direct bonding process, a fusion bonding process, or a hybrid bonding process, for example. The first IC die 102a and second IC die 102b are bonded together at a bond interface, such that the nearest faces (e.g., 108a, 108b in FIG. 1) of the first and second seal ring segments are in direct contact with one another, and nearest faces (e.g., 110a, 110b in FIG. 1) of the first and second contact plugs are in direct contact with one another. The first and second planar surfaces of the seal ring segments are configured to directly contact one another to form a seal ring, so as to provide a sufficient contact area that yields a hybrid bond of sufficient strength to reliably bond the first IC die 102a to the second IC die 102b. The first and second contact pads or plugs are also in direct contact, thereby electrically coupling the first contact pads or plugs to the second contact pads or plugs. The seal ring perimetrically surrounds a gas reservoir which is in fluid communication with the ambient environment solely through the sidewall recesses, which establish sidewall vent openings.

Figure 13A:
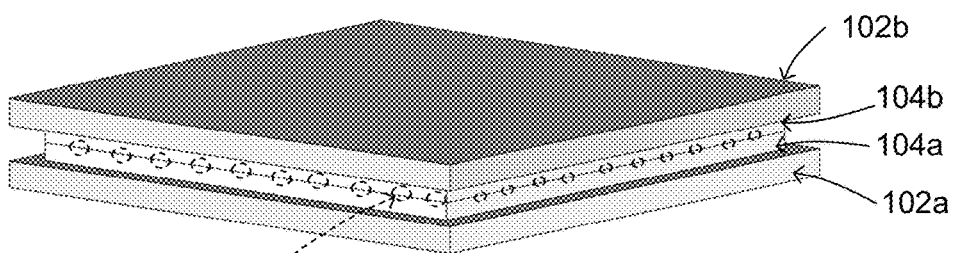
Figure 13B:
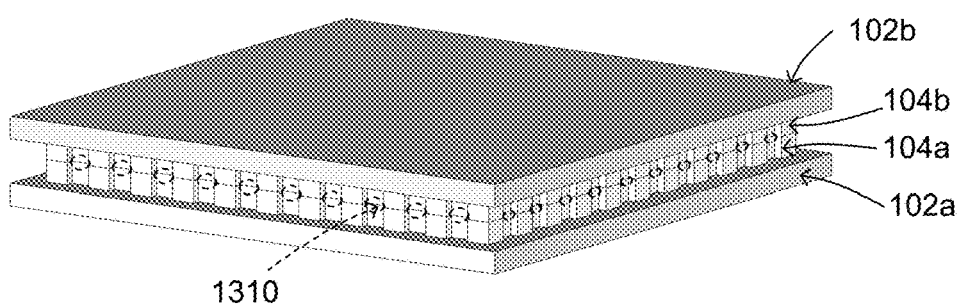
Figure 13C:
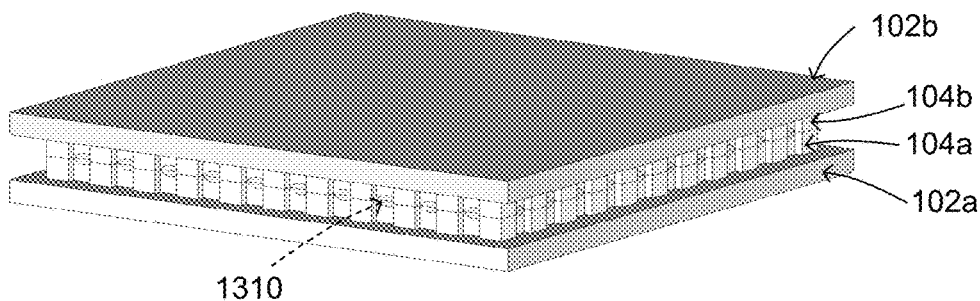

In FIG. 13A-13C, additional process steps are carried out to form material 1310 that blocks or "pinches off" the sidewall vent openings after bonding is complete. In FIG. 13A, an anneal or other heat treatment is carried out to at least partially liquefy the first and second seal ring segments 104a, 104b to close or "pinch off" the sidewall vent openings. The heat treatment also causes the first and second seal ring segments 104a, 104b, which were previously distinct crystal structures, to form crystalline grains that grow across the previous planar interface at which the first and second seal ring segments met. Thus, this heat treatment, which can take the form of an anneal for example, can partially melt the first and/or second seal ring segments to coalesce into a single continuous body of conductive material. This helps to ensure the seal ring provides good protection from the ambient environment after manufacturing is complete. In FIG. 13A, the anneal or other heat treatment is carried out in a manner that the seal ring outer sidewalls are a substantially continuous planar surface along their outer perimeter.

In FIG. 13B, the additional process steps, which could take the form of a heat treatment or deposition, are carried out such that the seal ring outer sidewalls include ridges. The narrow portion of the ridges include material 1310 that blocks the sidewall vent openings. Thus, the structure includes wide ridges corresponding to wide portions 904 and narrow ridges which correspond to narrow portions 902.

In FIG. 13C, material 1310 takes the form of a protective layer, such as a nitride, oxide, epoxy, or ceramic among others, that has been formed over the outer sidewalls of the seal ring structure to cover, fill, and/or plug the sidewall vent openings, thereby helping ensure good protection from the ambient environment after manufacturing is complete. In some embodiments, the protective layer can be made of a different material and/or can have a different lattice structure (e.g., a different crystalline lattice structure) than the other portions of the first and second seal ring segments 104a, 104b.

Figure 14:
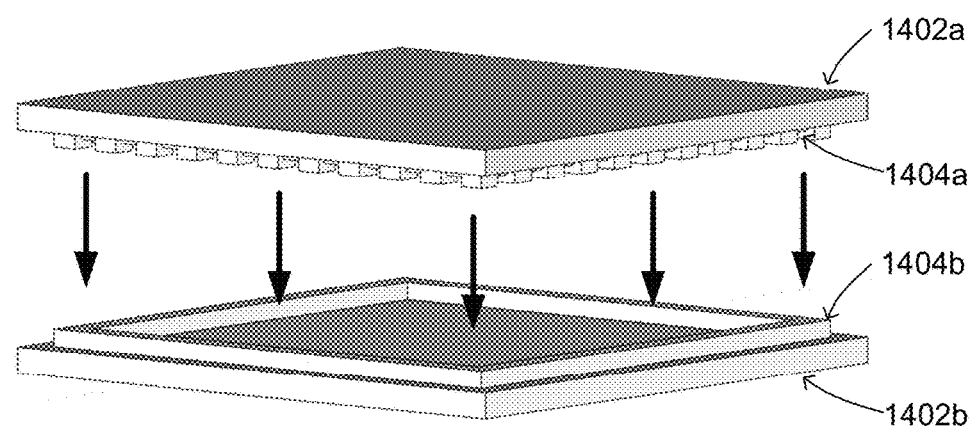
FIGS. 14, 15, and 16A-16B illustrate perspective views of some other embodiments that may be utilized in the methods depicted in FIGS. 8 through 13A-13C.
Figure 15:
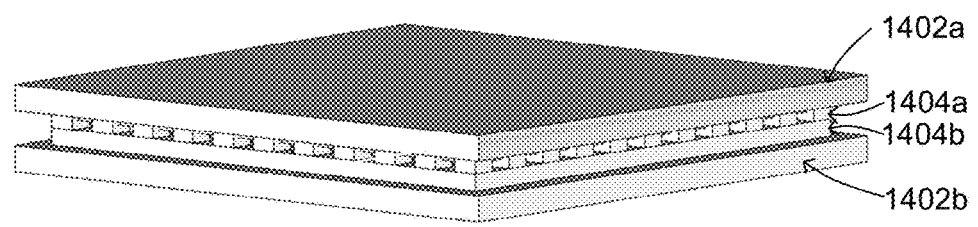
Figure 16A:
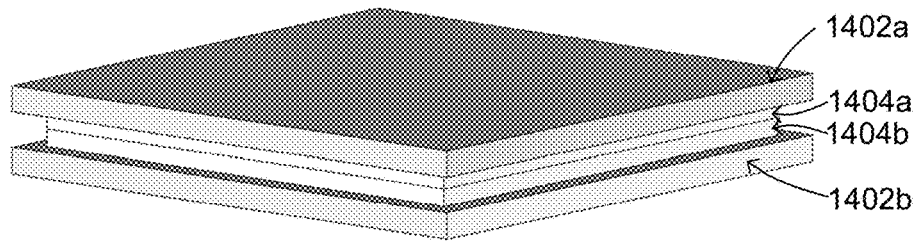
Figure 16B:
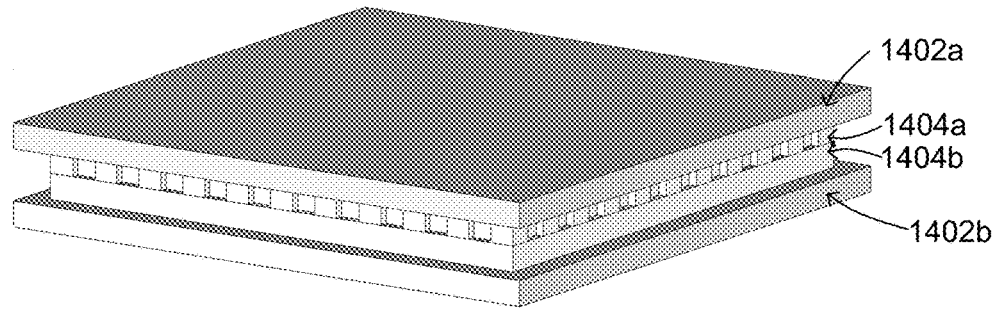

While FIGS. 11-13 show a manufacturing example where the first and second IC dies each include a seal ring that include one or more sidewall vent openings, in other embodiments, one of the first and second IC dies can include a fully planar upper surface for its seal ring segment and the other of the first and second IC dies can include one or more sidewall vent openings. FIGS. 14-15 illustrate one such example. In FIG. 14, the first IC die 1402a includes a first seal ring segment 1404a having a series of large box-like or cube-like structures having a first width and first height, and which alternate with small box-like or cube-like structures having a second width and second height. The first width is larger than the second width, and the first height is larger than the second height, which gives rise to sidewall vent openings in the first IC die 1402a. The second IC die 1402b includes a second seal ring segment 1404b having a planar upper surface that extends continuously around an entire upper surface of the second seal ring segment 1404b. In FIG. 15, the first IC die 1402a is bonded to the second IC die 1402b, for example through a direct bonding process, a fusion bonding process, or a hybrid bonding process, for example. In FIGS. 16A-16B, additional process steps are carried out to block or "pinch off" the sidewall vent openings after bonding is complete.

Figure 17:
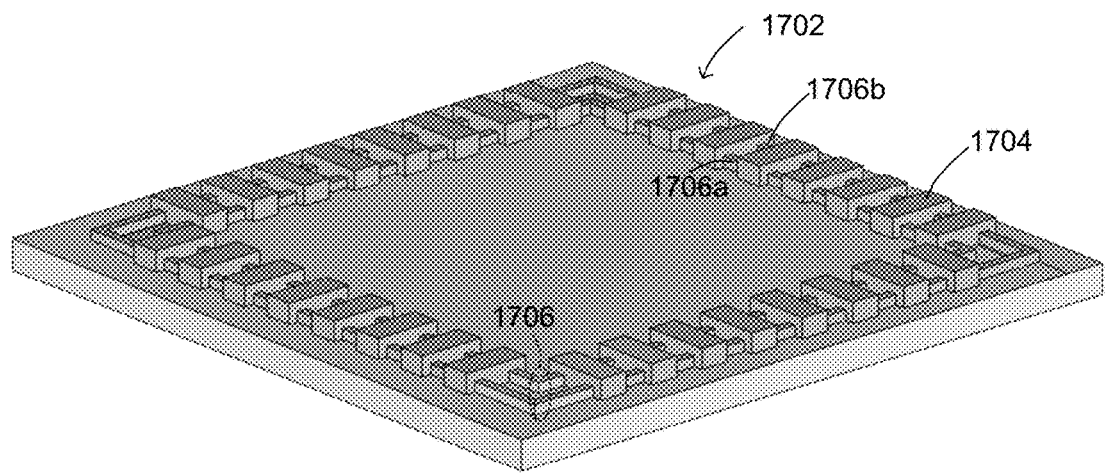
FIG. 17 illustrates a perspective view of some other embodiments of a first or second IC die that includes a seal ring segment.
Figure 18:
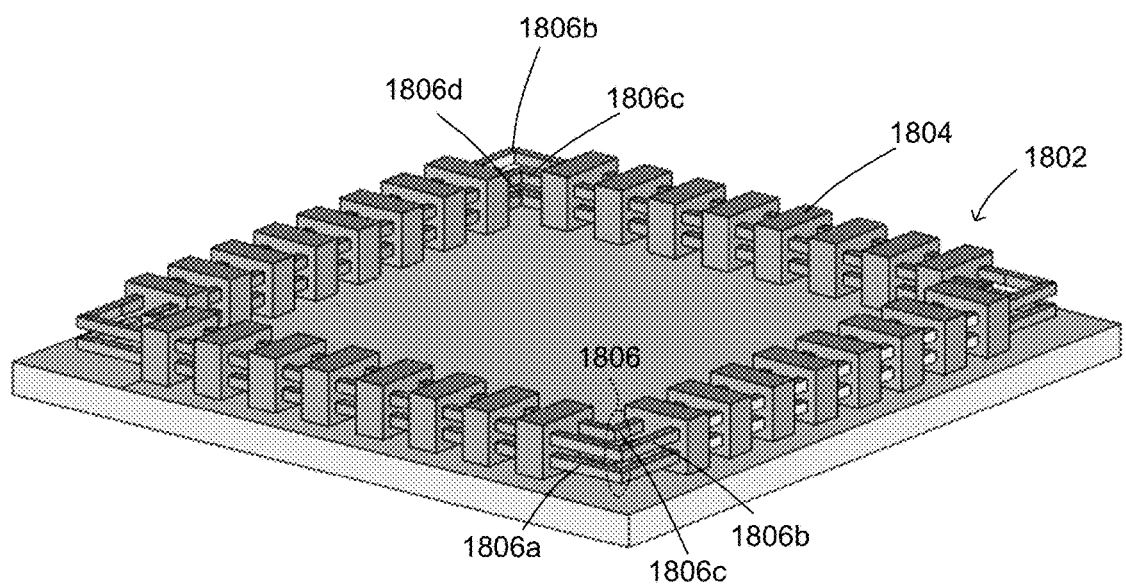
FIG. 18 illustrates a perspective view of some other embodiments of a first or second IC die that includes a seal ring segment.

FIGS. 17 and 18 illustrate some additional embodiments in which a first and/or second seal ring segment includes a plurality of ring-shaped segments that are concentrically aligned about a central axis which is perpendicular to a face of the IC die. In FIG. 17, a seal ring segment 1702 includes a series of relatively wide and relatively tall cube-like or box-like structures 1704, which are separated from one another by relatively narrow cube-like or box-like structures 1706. In this case, the relatively narrow cube-like or box-like structures are arranged in two concentric rings—an inner ring 1706a, and outer ring 1706b. Upper surfaces of the two concentric rings 1706 are recessed relative to the upper surfaces of the relatively wide and relatively tall cube-like or box-like structures 1704, such that upper surfaces of the relatively narrow cube-like or box-like structures 1706 correspond to gas vent openings. The structure of FIG. 17 can again be formed by using lithography to pattern a bond ring precursor, which has a substantially planar upper surface around the entire bond ring precursor and a combination of relatively wide and relatively narrow features, and then performing CMP on the bond ring precursor to planarize the upper surface of the relatively wide features 1704 and to recess the relatively narrow features 1706 to efficiently form the gas vent openings.

In FIG. 18, a seal ring segment 1802 includes a series of relatively wide and relatively tall cube-like or box-like structures 1804, which are separated from one another by relatively narrow cube-like or box-like structures 1806. The narrow cube-like or box-like structures 1806 include multiple rails 1806a, 1806b, 1806c, 1806d that are stacked over one another to give rise to the gas vent openings. This structure can be formed using multiple lithography and etching steps, and while falling within the scope of the present disclosure, is less efficient from a processing perspective than some other embodiments where CMP is used to form the sidewall gas vent openings.

Figure 19:
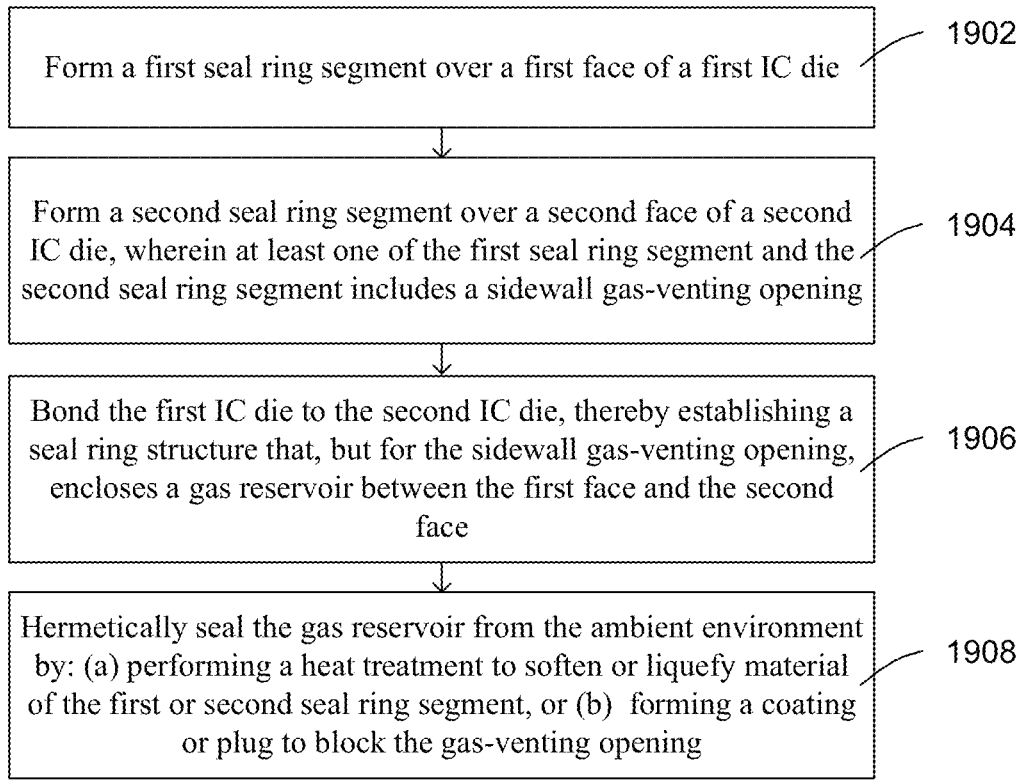
FIG. 19 illustrates a manufacturing method as a flow chart in accordance with some embodiments.

FIG. 19 illustrates a method in accordance with some embodiments. At 1902, a first seal ring segment is formed over a first face of a first IC die. The first seal ring segment perimetrically encloses a first area on the first face of the first IC die and includes a first bonding surface region. In some embodiments, 1902 can correspond to FIG. 9 or FIG. 10.

At 1904, a second seal ring segment is formed over a second face of a second IC die. The second seal ring segment perimetrically encloses a second area on the second face of the second IC die and includes a second bonding surface region. In some embodiments, 1904 can correspond to forming 102b in FIG. 11. At least one of the first seal ring segment and the second seal ring segment, if not both, includes a sidewall gas-venting opening.

At 1906, the first IC die is bonded to the second IC die so the first bonding surface region contacts the second bonding surface region. Thus, a seal ring structure that encloses a gas reservoir between the first face and the second face is established. The sidewall gas-venting opening is configured to allow gas to pass between the gas reservoir and an ambient environment surrounding the 3D IC. In some embodiments, 1906 can correspond to FIG. 11 or FIG. 14.

At 1908, the gas reservoir is hermetically sealed from the ambient environment. In the illustrated embodiment, this can be achieved by (a) performing a heat treatment to soften or liquefy material of the first seal ring segment or the second seal ring segment, thereby pinching off the opening, or by (b) forming a coating or plug to block the opening and hermetically seal the gas reservoir from the ambient environment. In some embodiments, 1908 can correspond to FIGS. 13A-13C or FIGS. 16A-16B.

In view of the foregoing, some embodiments of the present application provide a method for manufacturing a three-dimensional (3D) integrated circuit (IC). In the method, a first seal ring segment is formed over a first face of a first IC die. The first seal ring segment perimetrically encloses a first area on the first face of the first IC die and includes a first bonding surface region. A second seal ring segment is formed over a second face of a second IC die. The second seal ring segment perimetrically encloses a second area on the second face of the second IC die and includes a second bonding surface region. At least one of the first seal ring segment and the second seal ring segment includes a sidewall gas-venting structure. The first IC die is bonded to the second IC die so the first bonding surface region contacts the second bonding surface region, thereby establishing a seal ring structure that encloses a gas reservoir between the first face and the second face. The sidewall gas-venting structure is configured to allow gas to pass between the gas reservoir and an ambient environment surrounding the 3D IC.

Other embodiments relate to a method for manufacturing a three-dimensional (3D) integrated circuit (IC). In the method, a first IC die precursor is formed with a first seal ring precursor extending outward from a face of the first IC die precursor. One or more conductive contact areas or plugs is circumscribed by the first seal ring precursor, and the seal ring precursor includes a bonding surface region including a first region having a first width and a second region having a second width less than the first width. A chemical mechanical planarization (CMP) process is performed on the first seal ring precursor and the one or more conductive contact areas or plugs, thereby forming a first IC die having a first seal ring segment. The CMP process makes upper surfaces of the one or more conductive contact areas or plugs co-planar with the first region of the bonding surface region and concurrently recesses upper surfaces of the second region for the first IC die. The first IC die is bonded to a second IC die so upper surfaces of the one or more conductive contact areas or plugs of the first IC die directly contact one or more corresponding conductive contact areas or plugs of the second IC die and so the upper surface of the first regions of the first seal ring segment directly contacts a second seal ring segment of the second IC die. The recessed upper surfaces of the second region provide gas vent openings to a gas reservoir between the first IC die and the second IC die.

Other embodiments relate to a method for manufacturing a three-dimensional (3D) integrated circuit (IC). In the method, a first seal ring segment is formed over a first face of a first IC die. The first seal ring segment circumscribes a first contact area or plug on the first face. A second seal ring segment is formed over a second face of a second IC die. The second seal ring segment circumscribes a second contact area or plug on the second face. At least one of the first seal ring segment and the second seal ring segment includes a sidewall gas-venting structure. The first seal ring segment is bonded to the second seal ring segment so the first contact area or plug contacts the second contact area or plug, thereby establishing a seal ring structure that encloses a gas reservoir between the first face and the second face such that the sidewall gas-venting structure facilitates gas flow between the gas reservoir and an ambient environment surrounding the 3D IC. The sidewall gas-venting structure is then pinched off either by performing a heat treatment to soften or liquefy material of the first or second seal ring segment or by depositing a coating on an outer sidewall of the seal ring structure.

Still other embodiments relate to a three-dimensional (3D) integrated circuit (IC). The 3D IC includes a first IC die and a second IC die. The first IC die includes a first semiconductor substrate, and a first interconnect structure over the first semiconductor substrate; and the second IC die includes a second semiconductor substrate, and a second interconnect structure that separates the second semiconductor substrate from the first interconnect structure. A seal ring structure separates the first interconnect structure from the second interconnect structure and perimetrically surrounds a gas reservoir between the first IC die and second IC die. The seal ring structure includes a sidewall gas-vent opening structure configured to allow gas to pass between the gas reservoir and an ambient environment surrounding the 3D IC.

Further embodiments relate to a three-dimensional (3D) integrated circuit (IC) including a first IC die and a second IC die. The first IC die includes a first semiconductor substrate, and a first interconnect structure, which includes a first contact pad, over the first semiconductor substrate. The second IC die includes a second semiconductor substrate and a second interconnect structure. The second interconnect structure separates the first interconnect structure from the second substrate and has a second contact pad in direct contact with the first contact pad. A seal ring, which includes a sidewall vent opening structure, perimetrically surrounds the first and second contact pads and perimetrically surrounds a gas reservoir between the first IC die and second IC die. A material is disposed in the sidewall vent opening structure and is configured to hermetically seal the gas reservoir from an ambient environment surrounding the 3D IC.

Other embodiments relate to a three-dimensional (3D) integrated circuit (IC) that includes a first IC die and a second IC die. The first IC die includes a first semiconductor substrate, a first interconnect structure over the first semiconductor substrate, and a first seal ring segment over the first interconnect structure. The first seal ring segment perimetrically surrounds an area of the first interconnect structure. The second IC die includes a second semiconductor substrate, a second interconnect structure, and a second seal ring segment. The second interconnect structure separates the first interconnect structure from the second substrate, and the second seal ring segment perimetrically surrounds an area of the second interconnect structure. The first seal ring segment has a first bonding surface that is in direct contact with a second bonding surface of the second seal ring segment, except for at a sidewall vent opening structure which penetrates entirely through at least one of the first seal ring segment or the second seal ring segment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a three-dimensional (3D) integrated circuit (IC), the method comprising:
   forming a first seal ring segment over a first face of a first IC die, wherein the first seal ring segment perimetrically encloses a first area on the first face of the first IC die and includes a first bonding surface region;

forming a second seal ring segment over a second face of a second IC die, wherein the second seal ring segment perimetrically encloses a second area on the second face of the second IC die and includes a second bonding surface region, wherein at least one of the first seal ring segment and the second seal ring segment includes a sidewall gas-venting structure;

bonding the first IC die to the second IC die so the first bonding surface region contacts the second bonding surface region, thereby establishing a seal ring structure that encloses a gas reservoir between the first face and the second face, wherein the sidewall gas-venting structure is configured to allow gas to pass between the gas reservoir and an ambient environment surrounding the 3D IC; and performing a heat treatment to soften or liquefy material of the first seal ring segment or the second seal ring segment to pinch off the sidewall gas-venting structure and hermetically seal the gas reservoir from the ambient environment.

2. The method of claim 1, wherein the sidewall gas-venting structure comprises an opening that fully penetrates through at least one sidewall of the at least one of the first seal ring segment and the second seal ring segment.

3. The method of claim 1, wherein the first seal ring segment comprises
a series of cube-like or box-like structures having different heights and different widths which perimetrically enclose the first area, and wherein a difference in the heights and/or widths gives rise to the sidewall gas-venting structure.

4. The method of claim 3, further comprising:
prior to bonding the first seal ring segment to the second seal ring segment, performing a chemical mechanical polishing (CMP) process on the first bonding surface region of the first seal ring segment; and
wherein the CMP process reduces the heights of cube-like or box-like structures having smaller widths faster than the CMP process reduces the heights of cube-like or box-like structures having larger widths, thereby forming a recess in the first bonding surface region of the first seal ring segment, wherein the recess corresponds to the sidewall gas-venting structure.

5. The method of claim 1:
wherein the first IC die comprises a first semiconductor substrate, and a first interconnect structure over the first semiconductor substrate;
wherein the second IC die comprises a second semiconductor substrate, and a second interconnect structure that separates the second semiconductor substrate from the first interconnect structure; and
wherein the seal ring structure separates the first interconnect structure from the second interconnect structure and perimetrically encloses the gas reservoir.

6. The method according to claim 5, wherein the seal ring structure is conductive but is electrically isolated from both the first interconnect structure and the second interconnect structure.

7. The method according to claim 1, wherein the first seal ring segment includes a first sidewall gas-venting structure having a first opening that passes fully through the first seal ring segment and wherein the second seal ring segment includes a second sidewall gas-venting structure having a second opening that passes fully through the second seal ring segment.

8. The method according to claim 7, wherein the first opening is aligned with the second opening so as to coalesce into a single opening passing fully through the first seal ring segment and fully through the second seal ring segment.

9. A method for manufacturing a three-dimensional (3D) integrated circuit (IC), the method comprising:
forming a first IC die precursor with a first seal ring precursor extending outward from a face of the first IC die precursor, and wherein one or more conductive contact areas or plugs is circumscribed by the first seal ring precursor, wherein the first seal ring precursor includes a bonding surface region including a first region and a second region arranged one next to another along a perimeter of the first seal ring precursor, the first region having a first width and the second region having a second width less than the first width;
performing a chemical mechanical planarization (CMP) process on the first seal ring precursor and the one or more conductive contact areas or plugs, thereby forming a first IC die having a first seal ring segment; and
bonding the first IC die to a second IC die so upper surfaces of the one or more conductive contact areas or plugs of the first IC die directly contact one or more corresponding conductive contact areas or plugs of the second IC die;
wherein the first seal ring segment comprises a series of cube-like or box-like structures along a perimeter of the first seal ring segment, wherein the series of cube-like or box-like structures alternate in heights and widths so a pair of first cube-like or box-like structures, which each have the first width and a first height, are arranged on opposite sides of a second cube-like or box-like structure having the second width and a second height, the first height being greater than the second height.

10. The method of claim 9, further comprising:
forming a gas vent opening between a second seal ring segment of the second IC die and a recessed upper surface of the first seal ring segment;
wherein the gas vent opening is connected to a gas reservoir between the first IC die and the second IC die.

11. The method according to claim 10, wherein the first seal ring segment includes a first sidewall gas-venting structure that passes fully through the first seal ring segment and wherein the second seal ring segment includes a second sidewall gas-venting structure that passes fully through the second seal ring segment.

12. The method of claim 10, wherein after the bonding the first IC die to the second IC die, upper surfaces of the first cube-like or box-like structures of the first seal ring segment on the first IC die directly contact the second seal ring segment of the second IC die, and the recessed upper surface of the first seal ring segment provides the gas vent opening to the gas reservoir between the first IC die and the second IC die.

13. The method of claim 10, further comprising:
after the bonding the first IC die to the second IC die, closing or covering the gas vent opening to hermetically seal the gas reservoir from an ambient environment external to the 3D IC.

14. The method according to claim 9, wherein each of the first cube-like or box-like structures has a first uppermost surface that is planar, and each of the second cube-like or box-like structures has a second uppermost surface that is rounded or tapered and the second uppermost surface is recessed below the first uppermost surface.

15. The method of claim 9, wherein after the CMP process, upper surfaces of the one or more conductive contact areas or plugs are co-planar with upper surfaces of the first region of the bonding surface region, and wherein upper surfaces of the second region of the bonding surface region for the first IC die are recessed from the upper surfaces of the first region.

16. A method for manufacturing a three-dimensional (3D) integrated circuit (IC), the method comprising:
forming a first seal ring segment over a first face of a first IC die, the first seal ring segment circumscribing a first contact area or plug on the first face;
forming a second seal ring segment over a second face of a second IC die, the second seal ring segment circumscribing a second contact area or plug on the second face, wherein at least one of the first seal ring segment and the second seal ring segment includes a sidewall gas-venting structure;
bonding the first seal ring segment to the second seal ring segment so the first contact area or plug contacts the second contact area or plug, thereby establishing a seal ring structure that encloses a gas reservoir between the first face and the second face such that the sidewall gas-venting structure facilitates gas flow between the gas reservoir and an ambient environment surrounding the 3D IC; and
pinching off the sidewall gas-venting structure either by performing a heat treatment to soften or liquefy material of the first or second seal ring segment or by depositing a coating on an outer sidewall of the seal ring structure;
wherein the first seal ring segment comprises a series of cube-like or box-like structures that alternate in height and width along a perimeter of the first seal ring segment, wherein a first width of a first cube-like or box-like structure is greater than a second width of a second cube-like or box-like structure, and wherein a first height of the first cube-like or box-like structure is greater than a second height of the second cube-like or box-like structure.

17. The method according to claim 16, wherein the first seal ring segment includes a first sidewall gas-venting structure having a first opening that passes fully through the first seal ring segment and wherein the second seal ring segment includes a second sidewall gas-venting structure having a second opening that passes fully through the second seal ring segment.

18. The method according to claim 17, wherein the first opening is aligned with the second opening so as to coalesce into a single opening passing fully through the first seal ring segment and fully through the second seal ring segment.

19. The method of claim 16, further comprising:
prior to bonding the first seal ring segment to the second seal ring segment,
performing a chemical mechanical polishing (CMP) process on a first bonding surface region and a second bonding surface region of a first seal ring precursor, wherein the first region having the first width and the second region having the second width; and
wherein the CMP process reduces a height of the second region faster than the CMP process reduces a height of the first region, thereby forming a recess in the second bonding surface region of the first seal ring precursor, wherein the recess corresponds to the sidewall gas-venting structure.

20. The method according to claim 16, wherein the first cube-like or box-like structure has an uppermost surface that is planar, and the second cube-like or box-like structure has an uppermost surface that is rounded or tapered and which is recessed below the uppermost surface of the first cube-like or box-like structure.

* * * * *